(12) United States Patent
Yoshioka et al.

(10) Patent No.: US 6,274,803 B1
(45) Date of Patent: Aug. 14, 2001

(54) THERMOELECTRIC MODULE WITH IMPROVED HEAT-TRANSFER EFFICIENCY AND METHOD OF MANUFACTURING THE SAME

(75) Inventors: Hirokazu Yoshioka, Osaka; Kazuo Kamada, Hirakata; Yoji Urano, Ikeda; Kentaro Kobayashi, Sijonawate, all of (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 09/574,069

(22) Filed: May 18, 2000

(30) Foreign Application Priority Data

Aug. 10, 1999 (JP) ................................. 11-226966

(51) Int. Cl.$^7$ .................................... H01L 35/00
(52) U.S. Cl. ......................... 136/201; 136/203; 136/242
(58) Field of Search ................... 136/201, 203, 136/205, 242; 62/3.2, 3.3

(56) References Cited

FOREIGN PATENT DOCUMENTS

| | | |
|---|---|---|
| 9-293909 | 11/1997 | (JP) . |
| 10-051039 | 2/1998 | (JP) . |
| 11-159907 | * 6/1999 | (JP) . |

* cited by examiner

*Primary Examiner*—Kathryn Gorgos
*Assistant Examiner*—Thomas H Parsons
(74) *Attorney, Agent, or Firm*—Oblon, Spivak, McClelland, Maier & Neustadt, P.C.

(57) ABSTRACT

A thermoelectric chip with exposed surfaces of N-type and P-type semiconductor elements on its top and bottom surfaces is prepared by arranging the semiconductor elements in a matrix manner such that each of the N-type semiconductor elements is disposed adjacent to the P-type semiconductor element through a space, and filling the space with a first resin material having electrical insulation. A metal layer is formed on each of the exposed surfaces of the semiconductor elements. Then, first electrodes are formed on the top surface according to a first circuit pattern. Similarly, second electrodes are formed on the bottom surface according to a second circuit pattern different from the first circuit pattern. An electrical insulation sheet of a second resin material containing a ceramic powder with high thermal conductivity is bonded to the top and bottom surfaces to obtain the thermoelectric module.

10 Claims, 9 Drawing Sheets

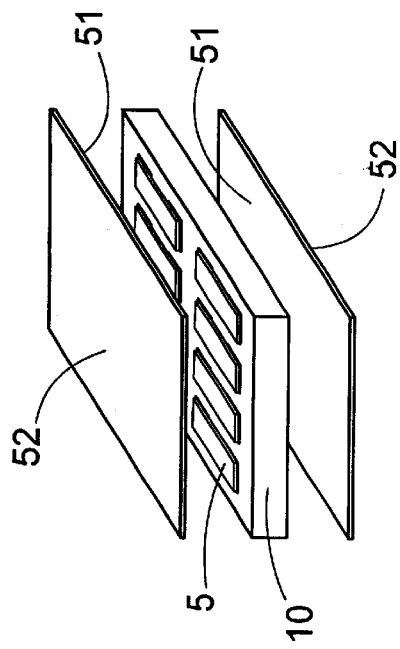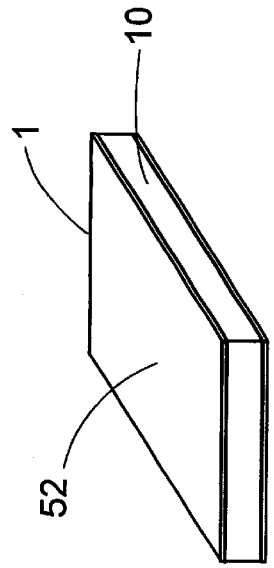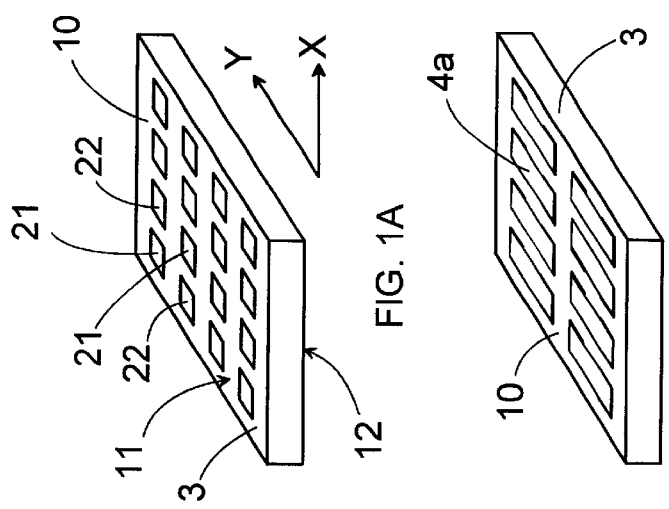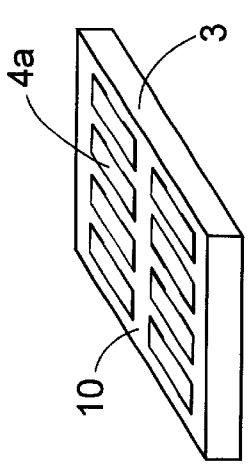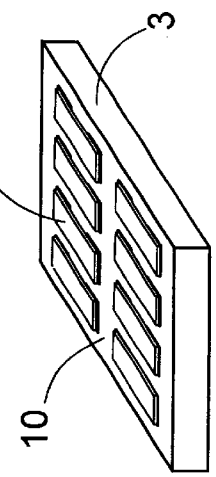
FIG. 1D
FIG. 1E
FIG. 1A
FIG. 1B
FIG. 1C

THERMOELECTRIC MODULE WITH IMPROVED HEAT-TRANSFER EFFICIENCY AND METHOD OF MANUFACTURING THE SAME

BACKGROUND OF THE INVENTION

1. Field of the Invention

The present invention relates to a thermoelectric module that is a temperature control device using Peltier effect, and particularly a thermoelectric module with improved heat-transfer efficiency, and a method of manufacturing the thermoelectric module.

2. Disclosure of the Prior Art

As shown in FIGS. 10A and 10B, a conventional thermoelectric module 1P has a structure comprising an arrangement of N-type semiconductor elements 21P and P-type semiconductor elements 22P, which are arranged in a matrix manner such that each of the N-type semiconductor elements 21P is disposed adjacent to the P-type semiconductor element 22P through a required space, upper electrodes 5P disposed on a top surface of the arrangement to connect between adjacent semiconductor elements 21P and 22P according to a first circuit pattern, lower electrodes 6P disposed on a bottom surface of the arrangement to connect between adjacent semiconductor elements 21P and 22P according to a second circuit pattern different from the first circuit pattern, and ceramic plates 8P such as sintered alumina plates bonded to the upper and lower electrodes 5P and 6P.

For example, when direct current is supplied to the thermoelectric module 1P, each of the upper electrodes 5P has the flow of electricity from N-type semiconductor element 21P to the P-type semiconductor element 22P, and on the other hand the each of the lower electrodes 6P has the flow of electricity from the P-type semiconductor element 22P to the N-type semiconductor element 21P. At this time, the upper electrodes 5P absorb heat from the surroundings through the ceramic plate 8P, and the lower electrodes 6P radiate heat to the surroundings through the ceramic plate 8P. Therefore, the thermoelectric module 1P works as a kind of heat pump for pumping heat from one side to the opposite side thereof, which is usually called Peltier effect. According to this principle, it is possible to use the thermoelectric module 1P as a temperature control device for electronic parts or circuit boards As materials for the semiconductor elements 21P and 22P, $Bi_2Te_3$ and $Sb_2Te_3$ are widely used. Since these compounds are brittle materials, cracks or chippings of the semiconductor elements easily occur during a manufacturing process of the thermoelectric module, so that there is a problem that the yields of the semiconductor-element materials are low. This increases the production cost and reduces a degree of reliability of the thermoelectric module. In addition, the ceramic plates 8P are usually soldered to the upper and lower electrodes 5P and 6P by the use of a solder material 9P to maintain the structural stability of the thermoelectric module 1P. Since thermal stress occurs according to a difference of thermal expansion coefficient between the semiconductor-element materials and the ceramic-plate material, cracks may be generated in the ceramic plates or the semiconductor elements by the thermal stress.

Japanese Patent Early Publication [KOKAI] No. 10-51039 discloses a thermoelectric module 1R having flexibility and resistance to thermal stress. In this thermoelectric module 1R, adjacent semiconductor elements 21R and 22R are mechanically connected by a supporting member 3R such as a silicone-resin adhesive having electrical insulation and flexibility in place of brittle ceramic plates, as shown in FIG. 11. Due to the flexibility of the supporting member 3R, the thermoelectric module 1R can be fitted and bonded to a curved surface. In addition, silicone films 51R having electrical insulation are formed on upper and lower electrodes 5R and 6R of the thermoelectric module 1R.

On the other hand, Japanese Patent Early Publication [KOKAI] No. 9-293909 discloses a method of manufacturing a thermoelectric module 1S for the purpose of increasing the yields of semiconductor-element materials. In this method, as shown in FIG. 12A, a thermoelectric chip 10S having exposed surfaces of N-type and P-type semiconductor elements 21S and 22S on its top and bottom surfaces 11S, 12S is prepared by making a matrix arrangement of the semiconductor elements, and integrally molding the matrix arrangement with an electrical insulation resin 3S such as epoxy resins. Subsequently, as shown in FIG. 12B, metal films 4S are formed on the exposed surfaces of the semiconductor elements 21S, 22S and the insulation resin 3S to connect between adjacent semiconductor elements according to a first circuit pattern on the top surface and a second circuit pattern on the bottom surface of the thermoelectric chip 10S. Copper electrodes 5S are then formed on the metal films 4S by electroplating, as shown in FIG. 12C. Since the semiconductor elements 21S and 22S are reinforced with the insulation resin 3S in the thermoelectric chip 10S, it is possible to reduce the occurrence of cracks or chippings of the semiconductor elements and improve the yields of the semiconductor element materials.

By the way, in order to accurately control the temperature of articles such as electronic parts and circuit boards by the use of the thermoelectric module, it is necessary to improve heat-transfer efficiency between the thermoelectric module and the articles, while maintaining electrical insulation therebetween. The silicone films 51R formed on the electrodes 5R, 6R of the thermoelectric module 1R shown in FIG. 11 provide the electrical insulation. However, the heat-transfer efficiency of the silicone film 51R is much lower than that of conventional ceramic materials. Conventional organic resins are of $\frac{1}{50}$th to $\frac{1}{200}$th thermal conductivity of alumina ceramic. Therefore, this thermoelectric module is susceptible to improvement from the viewpoint of heat-transfer efficiency.

On the other hand, in the thermoelectric module 1S of Japanese Patent Early Publication [KOKAI] No. 9-293909, a grease material 51S having electrical insulation is applied on the top and bottom surfaces 11S, 12S of the thermoelectric chip 10S, as shown in FIG. 12D, and then heat-transfer plates 52S made of a metal material having excellent thermal conductivity such as aluminum or copper are put on the grease material 51S, as shown in FIG. 12E. In this case, there are problems that the thermal conductivity of the grease material 51S is poor, and the structural stability of the thermoelectric module 1S is low because the heat-transfer plates 52S are merely put on the thermoelectric chip 10S through the grease material 51S. In addition, when the thickness of the grease material 51S partially becomes small, a short circuit may be caused between the electrodes and the heat-transfer plate. Therefore, it is required to apply the grease material 51S having poor thermal conductivity on the thermoelectric chip 10S with a thickness sufficient to maintain the electrical insulation therebetween.

SUMMARY OF THE INVENTION

In view of the above problems, a primary object of the present invention is to provide a thermoelectric module with improved heat-transfer efficiency. That is, the thermoelectric module of the present invention comprises:

a thermoelectric chip with exposed surfaces of first-type and second-type thermoelectric elements on its top and bottom surfaces, in which the thermoelectric telements are arranged in a matrix manner such that each of the first-type thermoelectric elements is disposed adjacent to the second-type thermoelectric element through a space, and the space is filled with a first resin material having electrical insulation;

a metal layer formed on each of the exposed surfaces of the thermoelectric elements on the top and bottom surfaces of the thermoelectric chip; first electrodes formed on the top surface of the thermoelectric chip according to a first circuit pattern, each of which electrically connects between adjacent thermoelectric elements; and second electrodes formed on the bottom surface of the thermoelectric chip according to a second circuit pattern different from the first circuit pattern, each of which electrically connects between adjacent thermoelectric elements;

wherein the thermoelectric module is provided with one of the following two components (A) and (B):

(A) an electrical insulation layer made of a second resin material containing a ceramic powder with high thermal conductivity, which is formed on at least one of the entire top surface with the first electrodes and the entire bottom surface with the second electrodes of the thermoelectric chip; and (B) an electrical insulation layer made of a third resin material, which is formed on at least one of the entire top surface with the first electrodes and the entire bottom surface with the second electrodes of the thermoelectric chip, and a heat-transfer layer composed of a metal sheet with a ceramic-sprayed coating having high thermal conductivity, which is formed on the insulation layer such that the ceramic sprayed coating contacts the insulation layer.

In the component (A), it is preferred to use an epoxy resin containing an aluminum-oxide powder as the second resin material containing the ceramic powder. It is also preferred that a content of the ceramic powder in the second resin material is within a range of 5 to 50 vol %. Moreover, it is preferred to have a conductive layer such as copper on the insulation layer of the second resin material containing the ceramic powder. In the component (B), it is preferred to use a copper foil having an aluminum-oxide sprayed coating as the metal sheet with the ceramic-sprayed coating. It is also preferred that a thickness of the ceramic-sprayed coating is within a range of 10 to 100 $\mu$m, and more preferably 20 to 60 $\mu$m.

The thermoelectric module described above has the following advantages. In the thermoelectric module having the component (A), since the ceramic powder with high thermal conductivity is uniformly dispersed in the insulation layer, the heat-transfer efficiency of the thermoelectric module can be remarkably improved as compared with the case of simply forming an organic resin film having electrical insulation such as a silicone film introduced in the prior art. In addition, there is no need to worry about the problem of thermal stress. Therefore, it is possible to provide the thermoelectric module with a higher degree of reliability. On the other hand, in the thermoelectric module having the component (B), since the electrical insulation between the thermoelectric chip and the metal sheet is ensured by the ceramic-sprayed coating, a thickness of the insulation layer of the third resin material can be reduced to improve the heat-transfer efficiency of the thermoelectric module. In addition, since the ceramic-sprayed coating is thin, the thermoelectric module of the present invention exhibits good flexibility and resistance to thermal stress, unlike conventional thermoelectric modules with sintered-ceramic plates soldered on electrodes.

A further object of the present invention is to provide a method of manufacturing the thermoelectric module with improved heat-transfer efficiency. That is, the method comprises the steps of:

preparing a thermoelectric chip with exposed surfaces of first-type and second-type thermoelectric elements on its top and bottom surfaces by arranging the to thermoelectric elements in a matrix manner such that each of the first-type thermoelectric elements is disposed adjacent to the second-type thermoelectric element through a space, and filling the space with a first resin material having electrical insulation;

forming a metal layer formed on each of the exposed surfaces of the thermoelectric elements on the top and bottom surfaces of the thermoelectric chip;

forming first electrodes on the top surface of the thermoelectric chip according to a first circuit pattern such that each of the first electrodes electrically connects between adjacent thermoelectric elements; and forming second electrodes on the bottom surface of the thermoelectric chip according to a second circuit pattern different from the first circuit pattern such that each of the second electrodes electrically connects between adjacent thermoelectric elements; and bonding an electrical insulation sheet of a second resin material containing a ceramic powder with high thermal conductivity to at least one of the top surface with the first electrodes and the bottom surface with the second electrodes of the thermoelectric chip.

In addition, another object of the present invention is to provide a method of manufacturing a thermoelectric module with improved heat-transfer efficiency. That is, the method comprises the steps of:

preparing a thermoelectric chip with exposed surfaces of first-type and second-type thermoelectric elements on its top and bottom surfaces by arranging the thermoelectric elements in a matrix manner such that each of the first-type thermoelectric elements is disposed adjacent to the second-type thermoelectric element through a space, and filling the space with a first resin material having electrical insulation;

forming a metal layer formed on each of the exposed surfaces of the thermoelectric elements on the top and bottom surfaces of the thermoelectric chip;

forming first electrodes on the top surface of the thermoelectric chip according to a first circuit pattern such that each of the first electrodes electrically connects between adjacent thermoelectric elements; and forming second electrodes on the bottom surface of the thermoelectric chip according to a second circuit pattern different from the first circuit pattern such that each of the second electrodes electrically connects between adjacent thermoelectric elements;

placing an electrical-insulation adhesive sheet of a third resin material on at least one of the top surface with the first electrodes and the bottom surface with the second electrodes of the thermoelectric chip;

placing a metal sheet with a ceramic-sprayed coating having high thermal conductivity on the adhesive sheet such that the ceramic-sprayed coating contacts the adhesive sheet; and bonding the metal sheet to the thermoelectric chip by the adhesive sheet.

According to the above-described methods, it is possible to efficiently manufacture the thermoelectric module having high heat-transfer efficiency of the present invention with increased yields of the semiconductor element materials.

Further features of the present invention and effects brought thereby will be understood in detail from the following descriptions of preferred embodiments of the present invention referring to the attached drawings.

BRIEF DESCRIPTION OF THE DRAWINGS

FIGS. 1A to 1E are schematic diagrams showing a method of manufacturing a thermoelectric module according to an embodiment of the present invention;

DETAIL DESCRIPTION OF THE PREFERRED EMBODIMENTS

Figure 2A:
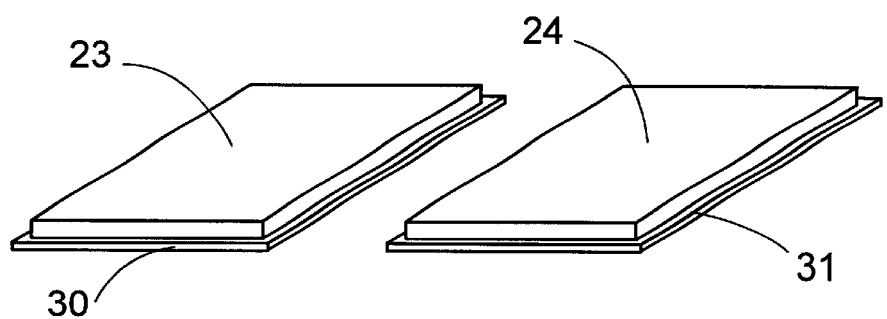
FIGS. 2A to 2E are schematic diagrams showing a process of preparing a thermoelectric chip.

Preferred embodiments of the present invention are explained in detail referring to the attached drawings.

A thermoelectric module of the present invention can be manufactured according to the following method. First, a thermoelectric chip 10 shown in FIG. 1A is prepared. In this embodiment, N-type semiconductor elements 21 made of $Bi_2Te_3$ and P-type semiconductor elements 22 made of $Sb_2Te_3$ are used as first-type and second-type thermoelectric elements, respectively. The thermoelectric chip 10 has a structure that the N-type and P-type semiconductor elements 21, 22 are arranged in a matrix manner such that each of the N-type semiconductor elements is disposed adjacent to the P-type semiconductor element through a required space in each of X and Y directions, and the space between adjacent semiconductor elements is filled with a first resin 3 having electrical insulation. As the first resin 3, for example, it is possible to use epoxy resins, phenol resins or polyimide resins. From the viewpoint of heat resistance, it is particularly preferred to use epoxy resins or polyimide resins. To improve adhesion between the semiconductor element with the first resin 3, the semiconductor elements 21, 22 may be previously coated with a polyimide resin. The thermoelectric chip 10 has exposed surfaces of the semiconductor elements 21, 22 on its top and bottom surfaces 11, 12.

Figure 2B:
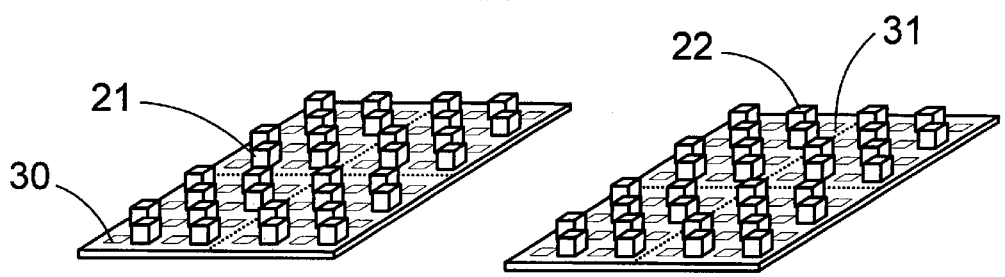
Figure 2C:
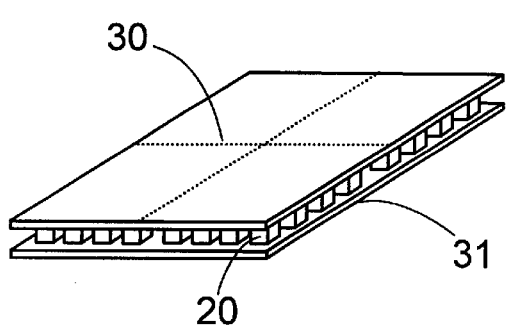
Figure 2D:
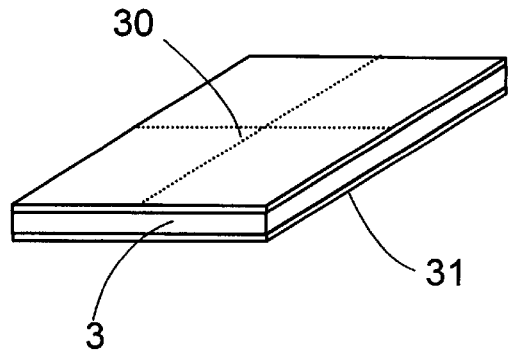
Figure 2E:
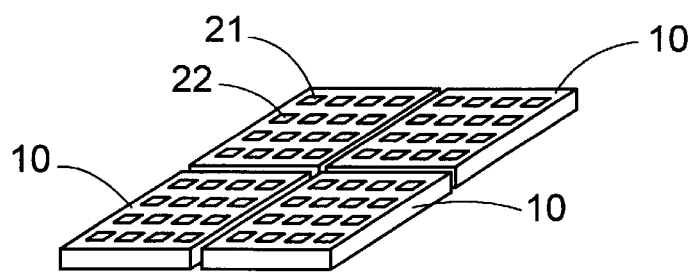

The thermoelectric chip 10 can be prepared according to the following process. As shown in FIG. 2A, wafers 23, 24 of the N-type and P-type semiconductor-element materials are bonded to plates 30, 31. Then, as shown in FIG. 2B, diesinking is performed to obtain arrangements of the N-type and P-type semiconductor elements 21, 22 on the plates 30, 31, respectively. The plate 30 is put on the plate 31 so that the matrix arrangement of the N-type and the P-type semiconductor elements 21, 22 is formed between the plates 30 and 31, as shown in FIG. 2C. A space between the plates 30 and 31 is filled with the first resin 3 to obtain a laminate, as shown in FIG. 2D. By removing the plates 30, 31 from the laminate, the thermoelectric chip 10 having the exposed surfaces of the semiconductor elements 21, 22 on its top and bottom surfaces is obtained, as shown in FIG. 2E.

Figure 3A:
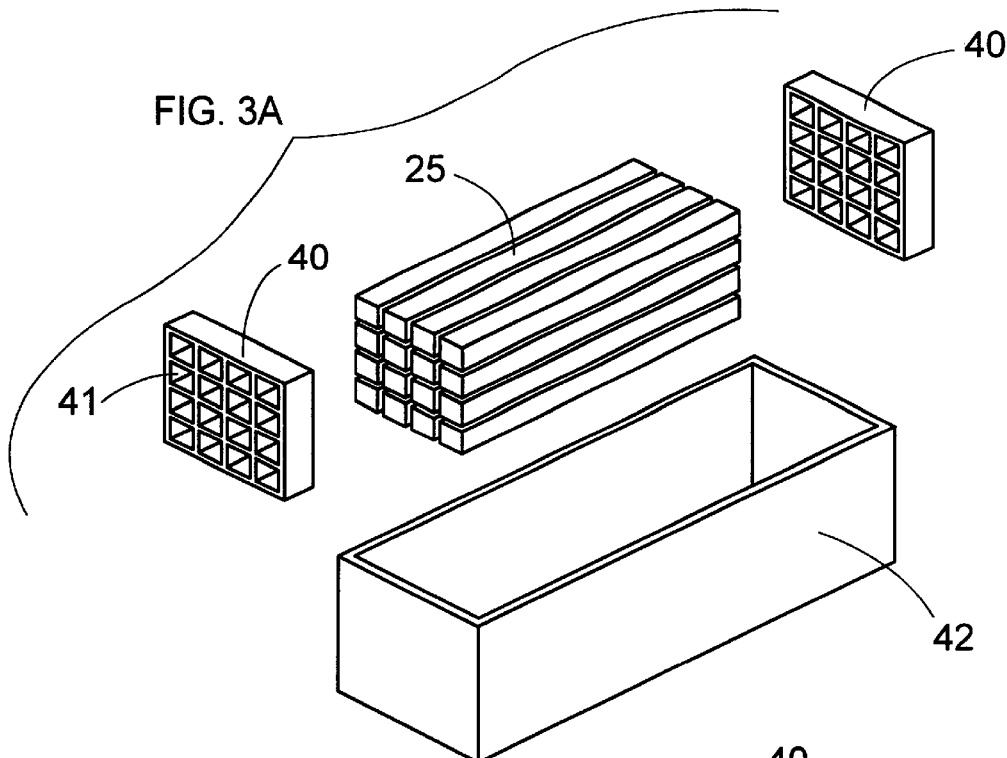
FIGS. 3A to 3C are schematic diagrams showing another process of preparing the thermoelectric chip.
Figure 3B:
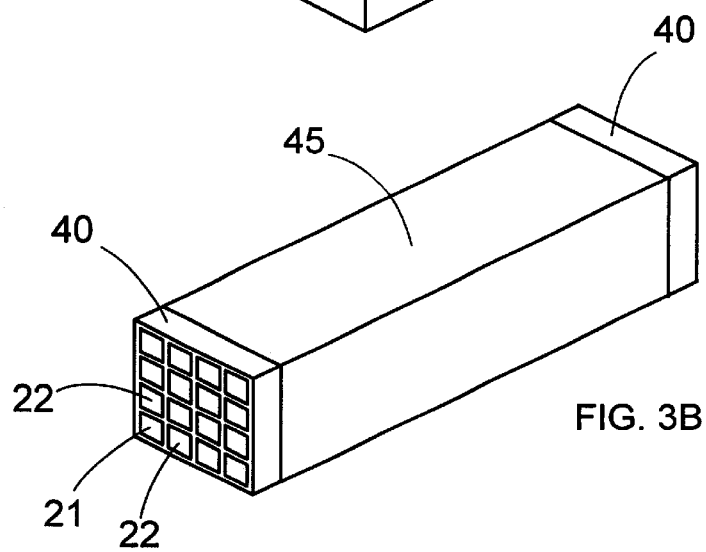
Figure 3C:
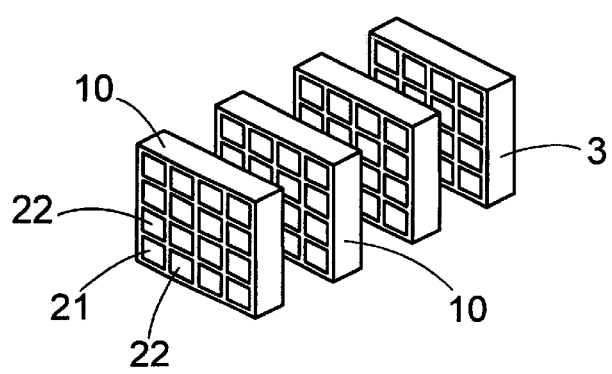

Alternatively, the thermoelectric chip 10 can be prepared according to the following process, which is disclosed in Japanese Patent Early Publication [KOKAI] No. 9-293909. That is, as shown in FIG. 3A, a bunch of semiconductor rods 25 are held by use of a pair of holding members 40. Each of the holding members 40 has a plurality of windows 41 for receiving the ends of the semiconductor rods 25. This holding member 40 can hold 16 (4×4) semiconductor rods 25. After the semiconductor rods 25 held by the holding members 40 are placed in a case 42, the first resin 3 is cast in the case 42 to mold the semiconductor rods 25 into one piece. As shown in FIG. 3B, the molded article 45 is cut in a direction perpendicular to the axis of the semiconductor rod 25 to obtain a plurality of thermoelectric chips 10, as shown in FIG. 3C. In this method, there is an advantage of efficiently providing the thermoelectric chips 10 having uniformity in dimension accuracy. In addition, since cutting is performed after the semiconductor rods 25 are integrally molded by the first resin 3, it is possible to prevent the occurrence of cracks or chippings in the semiconductor elements during the process of preparing the thermoelectric chip.

Figure 4A:
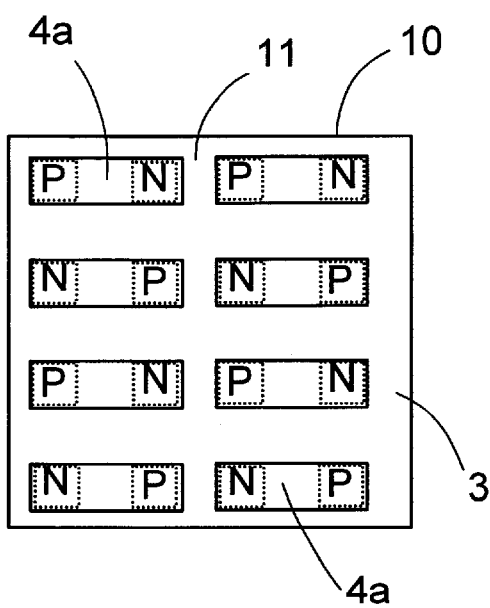
FIGS. 4A and 4B shows patterns of metal films formed on top and bottom surfaces of the thermoelectric chip.
Figure 4B:
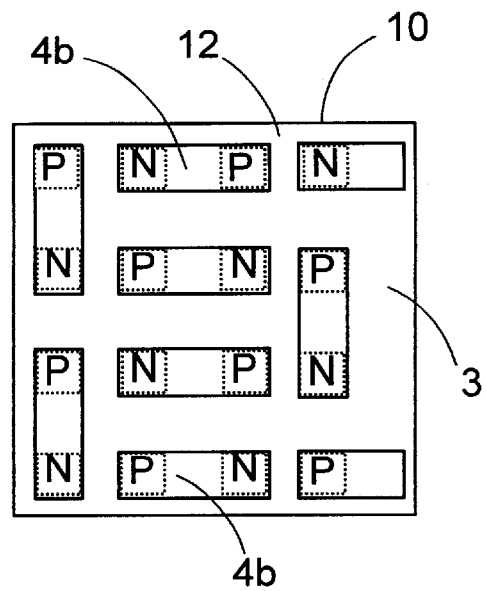

Next, as shown in FIG. 1B, metal films 4a, 4b are formed on the top and bottom surfaces 11, 12 of the thermoelectric chip 10. FIGS. 4A and 4B show first and second circuit patterns for the metal films 4a, 4b, respectively. On the top surface 11 of the thermoelectric chip 10, the metal films 4a are formed on the exposed surfaces of the semiconductor elements 21, 22 and the first resin 3 extending between adjacent semiconductor elements, so that each of the metal films 4a connects between the adjacent semiconductor elements according to the first circuit pattern. Similarly, on the bottom surface 12 of the thermoelectric chip 10, the metal films 4b are formed on the exposed surfaces of the semiconductor elements and the first resin 3 extending between adjacent semiconductor elements, so that each of the metal films 4b connects between the adjacent semiconductor elements according to the second circuit pattern different from the first circuit pattern. It is preferred that each of the metal films 4a, 4b is made of at least one of nickel (Ni) and tin (Sn). In addition, it is preferred to use spattering to form the metal films 4a, 4b. In this embodiment, 0.5 $\mu$m-thickness Ni films are formed as the metal films 4a, 4b by spattering.

Then, as shown in FIG. 1C, upper and lower electrodes 5, 6 of copper having a thickness of 0.5 mm are formed on the metal films 4a, 4b. That is, the upper electrodes 5 are formed on the metal films 4a according to the first circuit pattern, and the lower electrodes 6 are formed on the metal films 4b according to the second circuit pattern. In the present invention, since the metal films 4a, 4b are previously formed on the thermoelectric chip 10, it is possible to form the upper and lower electrodes 5, 6 by electroplating or electroless plating. When manufacturing the thermoelectric module with a relatively small power consumption, it is preferred to form the upper and lower electrodes 5, 6 having a thickness of 0.05 mm by electroless plating.

Alternatively, copper plates having a required thickness may be soldered to the metal films 4a, 4b by use of a solder cream. In this case, it is preferred that each of the metal films 4a, 4b has a two-layer structure composed of a 0.5 $\mu$m-thickness Ni layer as an intermediate layer and a 0.5 $\mu$m-thickness Sn layer as an outer layer. The solder cream can be preferably supplied on the metal films by printing. After the copper plates are placed on the solder cream printed on the metal films, heating is performed to bond the copper plates to the metal films by the solder cream.

Prior to the next step, if necessary, a surface-roughing treatment may be performed on the top surface 11 with the upper electrodes 5 and the bottom surface 12 with the lower electrodes 6 of the thermoelectric chip 10 to improve adhesion between a resin material used in the next step and the thermoelectric chip 10. For example, an aqueous solution of permanganic acid can be used to rough exposed surfaces of the first resin 3 of the thermoelectric chip 10. On the other hand, a chemical etching agent "CZ-8100" (manufactured by MEC COMPANY LTD) can be used to rough the surfaces of the upper and lower electrodes 5, 6 of copper.

Figure 5:
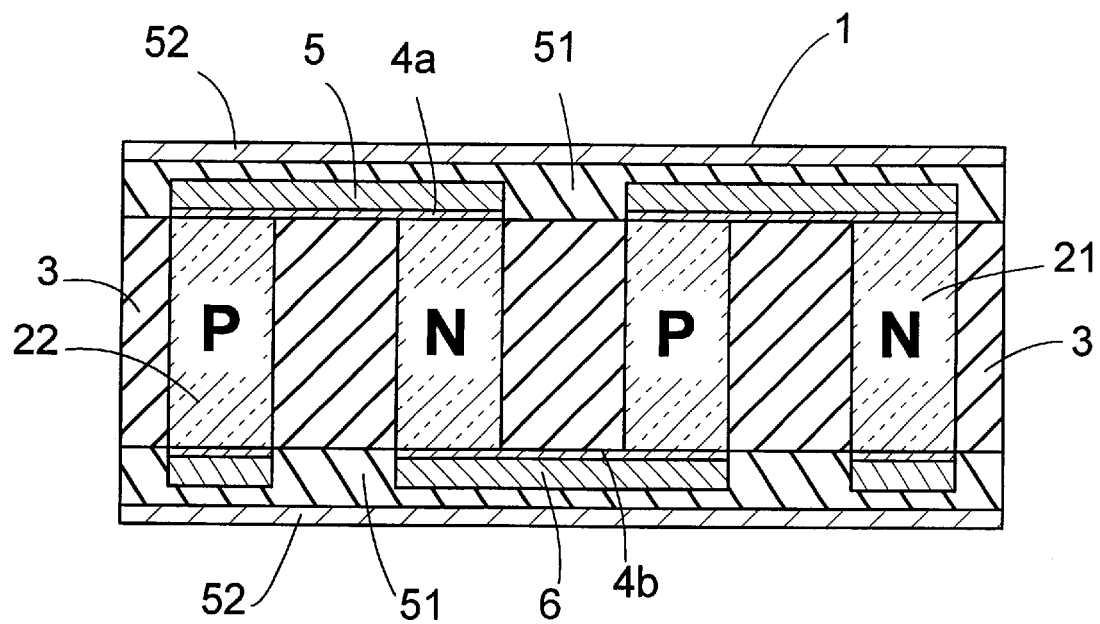
FIG. 5 is a cross-sectional view of a thermoelectric module according to the embodiment of the present invention.

Next, as shown in FIG. 1D, copper foils 52 (thickness: about 18 $\mu$m) each having an electrical insulation layer 51 on one surface thereof, which is made of a semi-cured epoxy resin containing an aluminum-oxide powder (average grain size: a few microns), are put on the top surface 11 with the upper electrodes 5 and the bottom surface 12 with the lower electrodes 6 of the thermoelectric chip 10 such that the electrical insulation layer 51 contacts the thermoelectric chip 10. Then, a heat treatment is performed to bond the copper foils 52 to the thermoelectric chip 10 through the electrical insulation layer 51, to thereby obtain the thermoelectric module 1, as shown in FIG. 1E. For example, it is preferred that the heat treatment is performed at a temperature of 150 to 200° C. A cross-sectional structure of the obtained thermoelectric module 1 is shown in FIG. 5.

It is preferred that a content of the aluminum-oxide powder in the epoxy resin is within a range of 5 to 50 vol %. When the content is less than 5 vol %, the thermal conductivity of the electrical insulation layer 51 may not be sufficiently improved. When the content is more than 50 vol %, the bonding strength of the electrical insulation layer 51 with the thermoelectric chip 10 and the copper foil 52 may deteriorate. When the content of the aluminum-oxide powder is within the above-defined range, the electrical insulation layer 51 can stably provide improved heat-transfer efficiency of the thermoelectric module 1, while maintaining good bonding strength between the copper foil 52 and the thermoelectric chip 10.

Although the aluminum-oxide ($Al_2O_3$) powder is used in this embodiment, it is also preferred to use a ceramic powder with a high thermal conductivity of 5 W/m·K or more, for example, aluminum nitride (AlN), boron nitride (BN), beryllium oxide (BeO), and silicon carbide (SiC). In addition, an electrical-insulation resin such as a polyimide resin may be used in place of the epoxy resin. If necessary, after the copper foils 52 are bonded to the thermoelectric chip 10 by the electrical insulation layer 51, a gold (Au) film may be formed on each of the copper foils 52 of the thermoelectric module 1 through a Ni film as an intermediate layer. Alternatively, it is possible to use a copper foil having the electrical insulation layer on a surface thereof and the Ni and Au films on the opposite surface. As a thickness of the copper foil 52, for example, it is preferred to select a thickness within a range of 15 to 40 $\mu$m.

Figure 6:
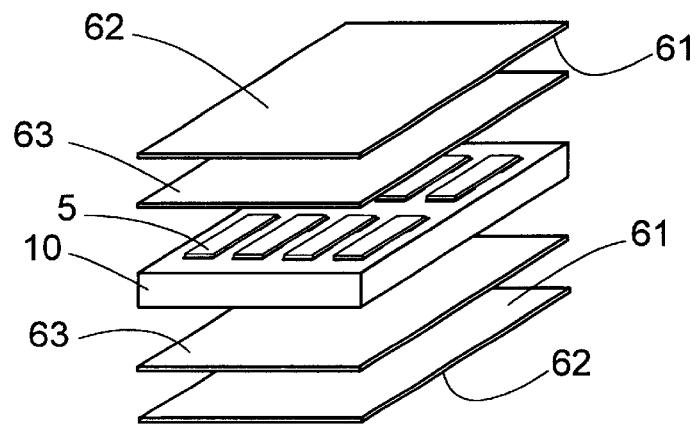
FIG. 6 is a diagram showing a modification of the method shown in FIG. 1.
Figure 7:
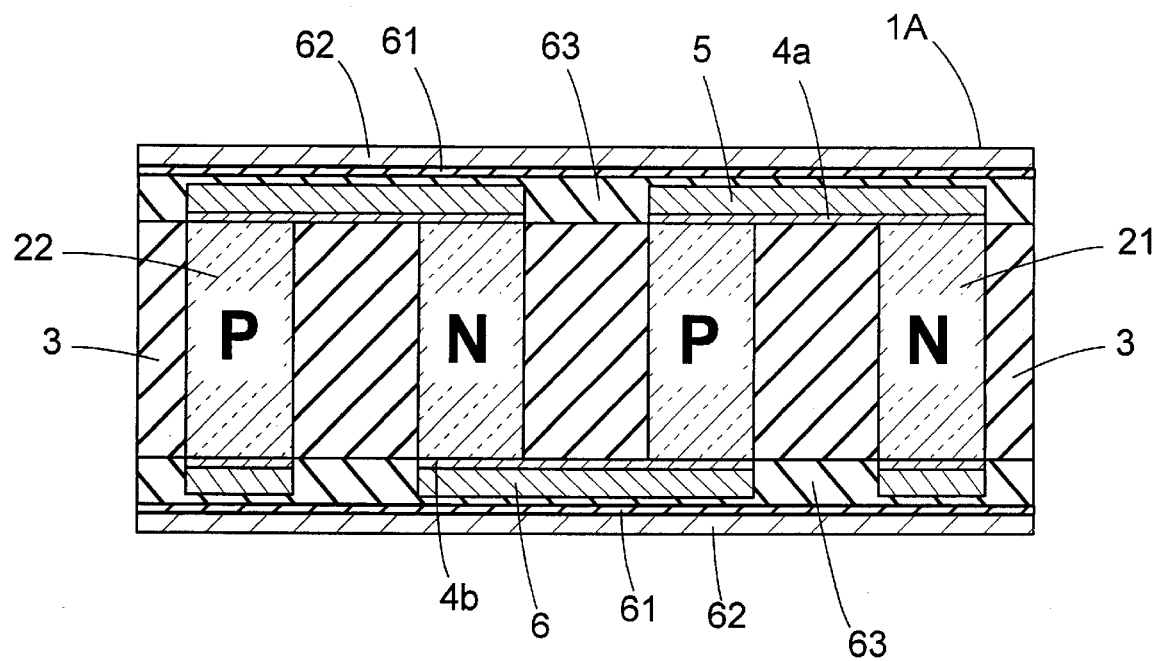
FIG. 7 is a cross-sectional view of a thermoelectric module obtained according to the modification of FIG. 6.

In place of the copper foil 52 having the electrical insulation layer 51, it is preferred to use a copper foil 62 with an aluminum-oxide sprayed coating 61 on a surface thereof. In this case, as shown in FIG. 6, the copper foils 62 are placed on the top surface 11 with the upper electrodes 5 and the bottom surface 12 with the lower electrodes 6 of the thermoelectric chip 10 through an adhesive sheet 63 of an epoxy resin having electrical insulation such that aluminum-oxide sprayed coating 61 contacts the adhesive sheet 63. Then, a heat treatment is performed to bond the copper foils 62 to the thermoelectric chip 10 through the adhesive sheet 63, to thereby obtain a thermoelectric module. For example, it is preferred that the heat treatment is performed at a temperature of 150 to 200° C. A cross-sectional structure of the obtained thermoelectric module 1A is shown in FIG. 7.

It is preferred that a thickness of the aluminum-oxide sprayed coating 61 is within a range of 10 to 100 $\mu$m, and more preferably 20 to 60 $\mu$m. When the thickness is less than 10 $\mu$m, the aluminum-oxide sprayed coating 61 may not be uniformly formed on the copper foil 52. In such a case, the reliability in electrical insulation between the copper foil 52 and the thermoelectric chip 10 lowers. As the aluminum-oxide sprayed coating 61 is thicker than 100 $\mu$m, the flexibility of the aluminum-oxide sprayed coating may gradually deteriorate, and the problem of thermal stress may occur. When the thickness of the aluminum-oxide sprayed coating is within the above-defined range, it is possible to provide the thermoelectric module with good flexibility and substantially avoid the problem of thermal stress. In addition, since the electrical insulation between the copper foil 62 and the thermoelectric chip 10 is ensured by the aluminum-oxide sprayed coating 61, it is possible to reduce a thickness of the adhesive sheet layer 63 between the aluminum-oxide sprayed coating 61 and the thermoelectric chip 10. The reduction in the thickness of the adhesive sheet layer 63 improves the heat-transfer efficiency of the thermoelectric module 1A.

In the present invention, it is possible to use a sprayed coating of $Al_xTi_yO_z$, $Al_2O_3+ZrO_2$, or $MgO+SiO_2$ in place of the $Al_2O_3$ sprayed coating mentioned above. From the viewpoint of the thermal conductivity, it is particularly preferred to use the $Al_2O_3$- or $Al_xTi_yO_z$-sprayed coating. In addition, an electrical-insulation resin such as an epoxy resin or a polyimide resin can be used as a material for the adhesive sheet 63. If necessary, after the copper foils 62 are bonded to the thermoelectric chip 10 by use of the adhesive sheets 63, an Au film may be formed on each of the copper foils 62 of the thermoelectric module 1A through a Ni film as an intermediate layer. Alternatively, it is possible to use a copper foil having the aluminum-oxide sprayed coating on a surface thereof and the Ni and Au films on the opposite surface. As a thickness of the copper foil 52, for example, it is preferred to select a thickness within a range of 15 to 40 $\mu$m.

Figure 8:
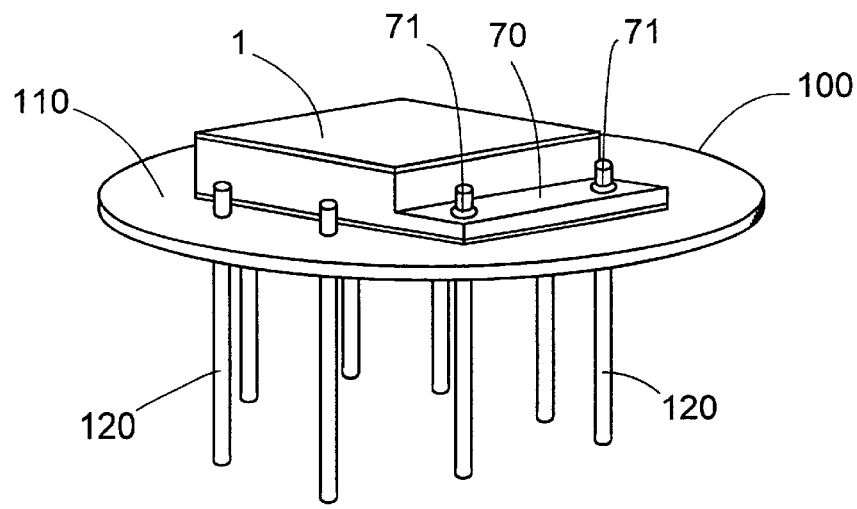
FIG. 8 is a perspective view of a thermoelectric module disposed on a metal stem according to the present invention.
Figure 9A:
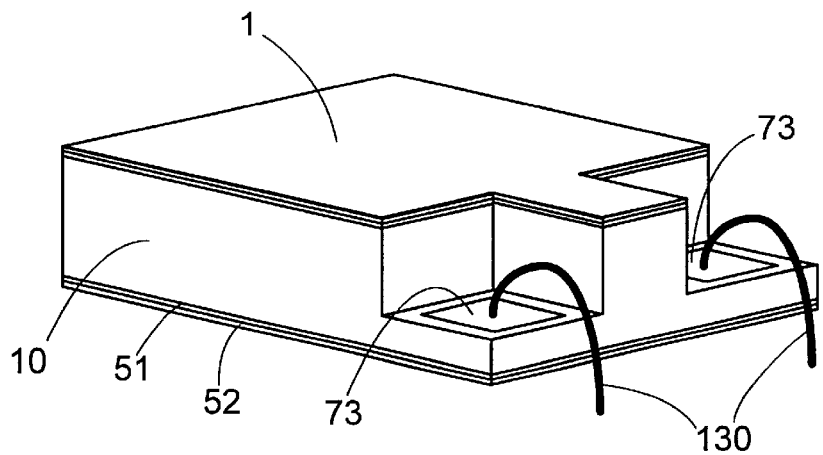
FIGS. 9A to 9C are diagrams each showing an electrical connection of lead wires with the thermoelectric module of the present invention.
Figure 9B:
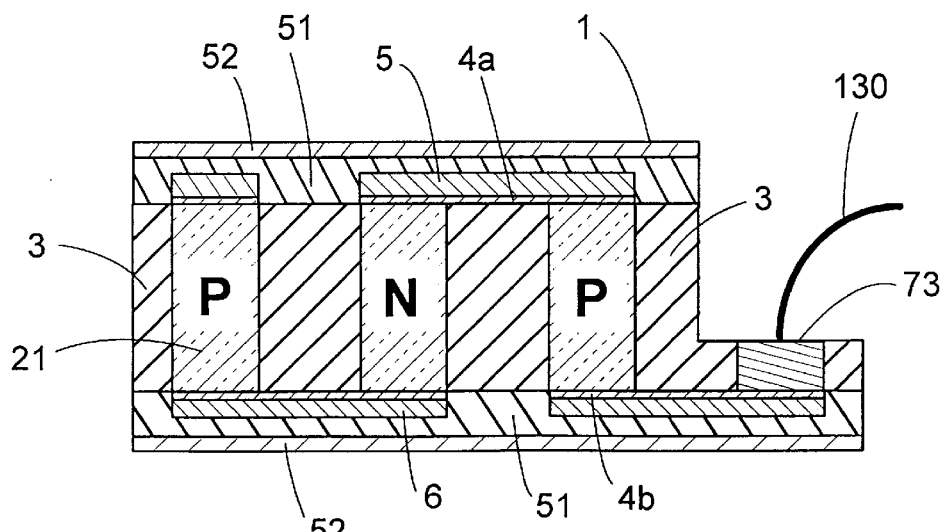
Figure 9C:
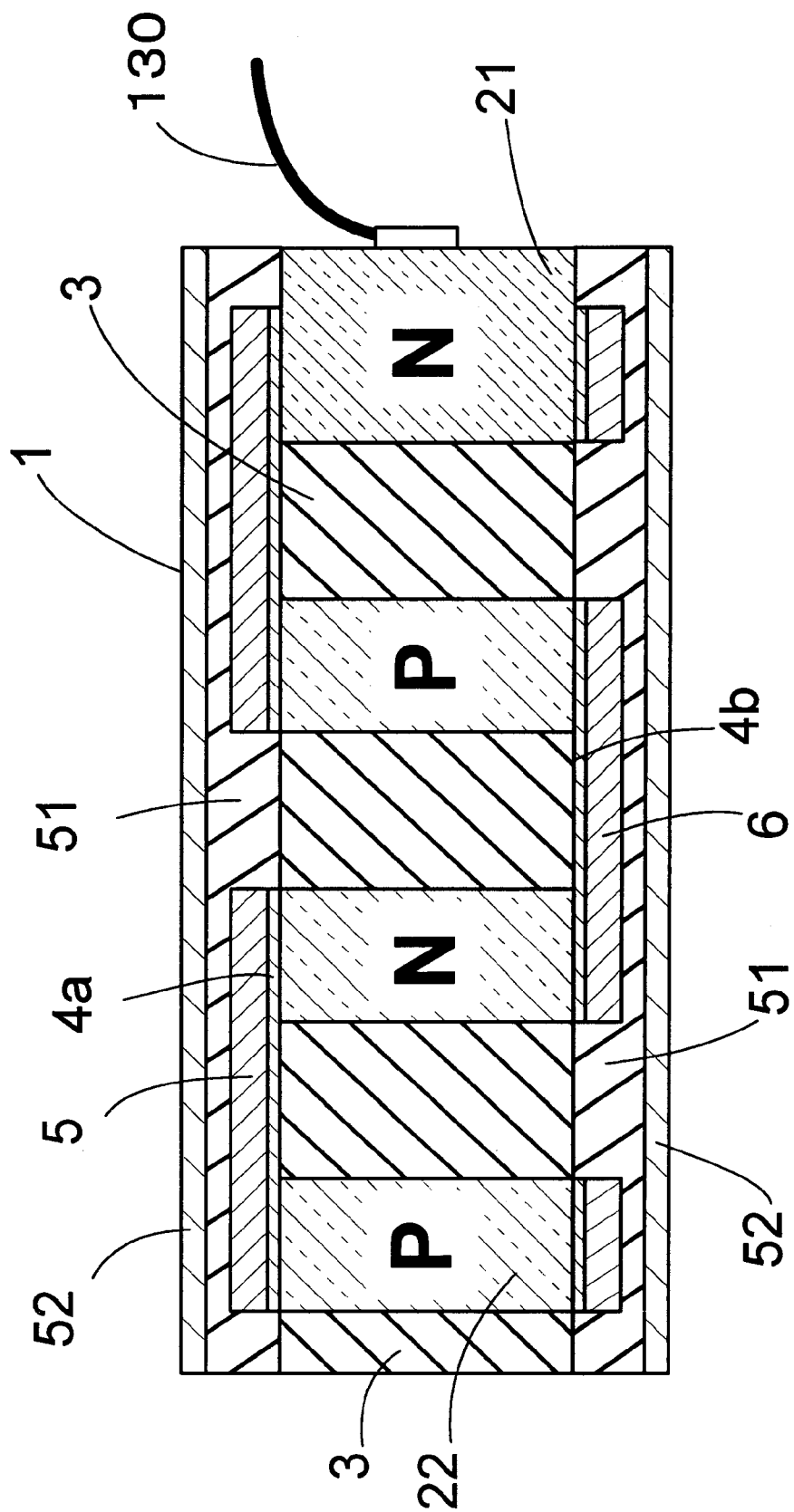
Figure 10A:
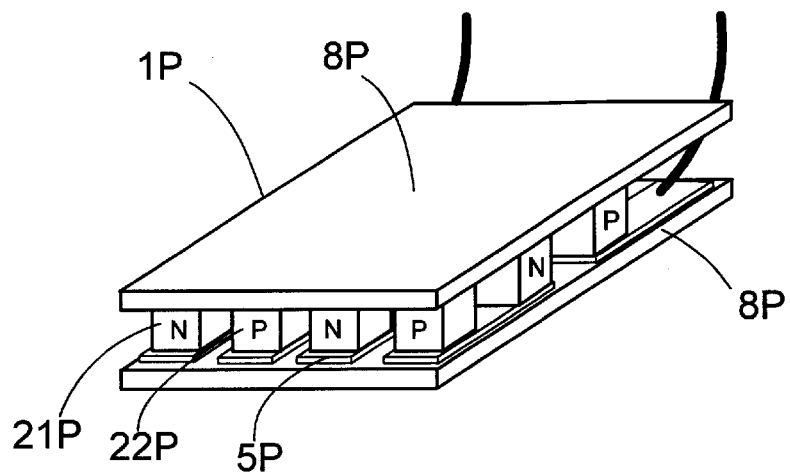
FIGS. 10A and 10B are perspective and cross-sectional views of a conventional thermoelectric module, respectively.
Figure 10B:
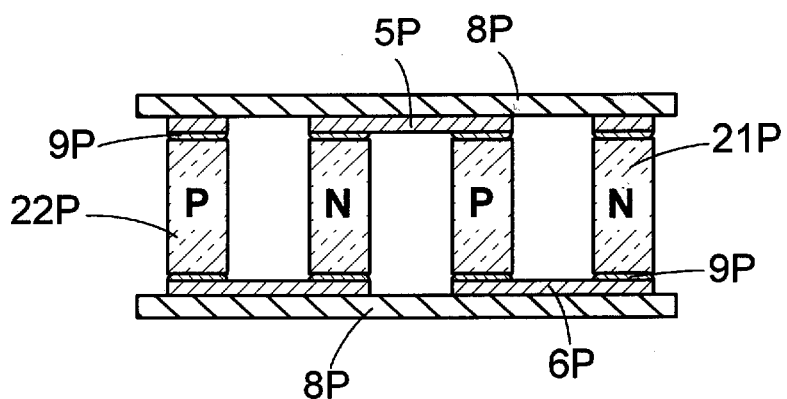
Figure 11:
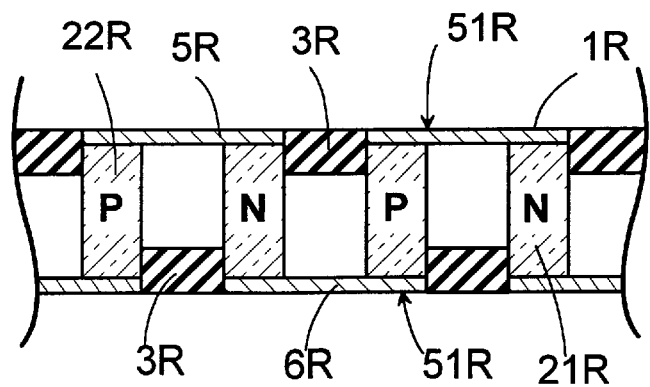
FIG. 11 is a partially cross-sectional view of a thermoelectric module of Japanese Patent Early Publication [KOKAI] No. 10-51039.
Figure 12D:
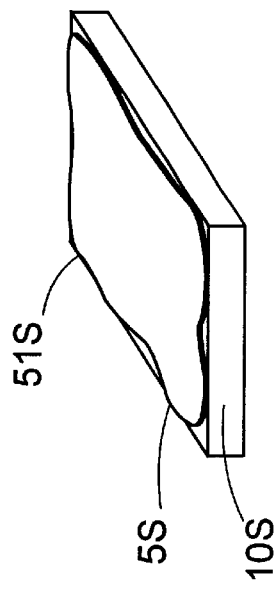
FIGS. 12A to 12E are schematic diagrams showing a method of manufacturing a thermoelectric module of Japanese Patent Early Publication [KOKAI] No. 9293909.
Figure 12E:
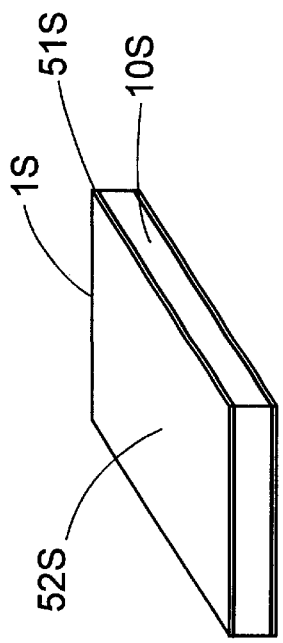
Figure 12A:
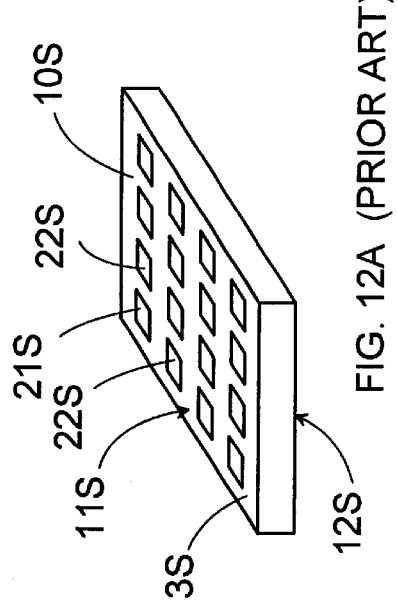
Figure 12B:
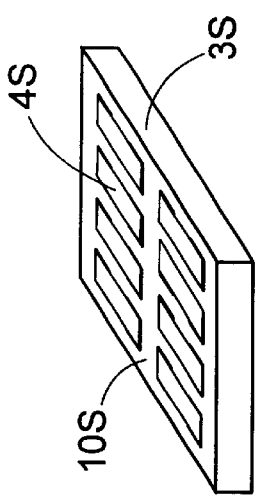
Figure 12C:
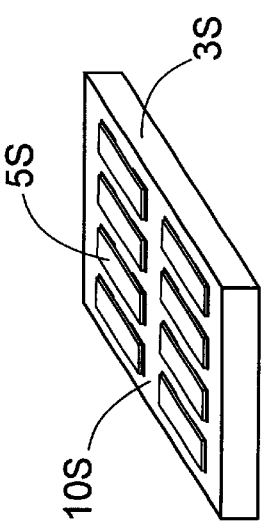

The thermoelectric module (1, 1A) of the present invention can be directly mounted on a metal stem 100 having a disc 110 and hermetic-sealed pins 120 passing through the disc. As shown in FIG. 8, the thermoelectric module (1, 1A) has a terminal portion 70, through which electric power is supplied to the thermoelectric module. The terminal portion 70 has a pair of through-holes 71 for receiving the pins 120 projecting on the disc 120. The thermoelectric module is bonded to the disc 110 by use of a solder material or a conductive paste. By inserting the pins 120 into the through-holes 71, the pins are directly connected to the thermoelectric module by use of the solder material or the conductive paste without using lead wires. In this case, there is no need to worry about failures caused by poor electrical connection of the lead wires. Alternatively, as shown in FIGS. 9A and 9B, terminal portions 73 of the thermoelectric module 1 can be connected to a power supply (not shown) through lead wires 130. In addition, as shown in FIG. 9C, lead wires 130 may be directly connected to exposed surfaces of required two semiconductor elements in the thermoelectric module 1.

In conclusion, the thermoelectric module of the present invention presents the following advantages.

(1) The thermoelectric module has improved heat-transfer efficiency. Therefore, the temperature of articles such as electronic parts and circuit boards can be accurately controlled by use of the thermoelectric module.

(2) It is possible to substantially avoid the problem of thermal stress. Therefore, a degree of reliability of the thermoelectric module increases.

(3) Since the semiconductor elements in the thermoelectric module are isolated from outside air and moisture, it is possible to provide the thermoelectric module with resistance to condensation.

(4) The thermoelectric module is excellent in flexibility and structural stability.

In the method of manufacturing the thermoelectric module of the present invention, it is possible to reduce the occurrence of cracks or chippings in brittle semiconductor elements during the manufacturing method by previously preparing the thermoelectric chip, apply electroplating or electroless plating other than the use of a solder cream to form the electrodes on the thermoelectric chip, and reduce the number of components required to manufacture the thermoelectric module by using the sheets of the electrical insulation resin containing ceramic powder or the metal sheets having ceramic sprayed coating. Therefore, the thermoelectric module with improved heat-transfer efficiency of the present invention can be efficiently manufactured with increased yields of the semiconductor-element material.

What is claimed is:

1. A thermoelectric module with improved heat-transfer efficiency comprising:

a thermoelectric chip with exposed surfaces of first-type and second-type thermoelectric elements on its top and bottom surfaces, in which said thermoelectric elements are arranged in a matrix manner such that each of said first-type thermoelectric elements is disposed adjacent to said second-type thermoelectric element through a space, and said space is filled with a first resin material having electrical insulation;

a metal layer formed on each of the exposed surfaces of said thermoelectric elements on the top and bottom surfaces of said thermoelectric chip;

first electrodes formed on the top surface of said thermoelectric chip according to a first circuit pattern, each of which electrically connects between adjacent thermoelectric elements; and second electrodes formed on the bottom surface of said thermoelectric chip according to a second circuit pattern different from the first circuit pattern, each of which electrically connects between adjacent thermoelectric elements;

wherein said thermoelectric module is provided with one of the following two components (A) and (B):

(A) an electrical insulation layer made of a second resin material containing a ceramic powder with high thermal conductivity, which is formed on at least one of the entire top surface with the first electrodes and the entire bottom surface with the second electrodes of said thermoelectric chip; and (B) an electrical insulation layer made of a third resin material, which is formed on at least one of the entire top surface with the first electrodes and the entire bottom surface with the second electrodes of said thermoelectric chip, and a heat-transfer layer composed of a metal sheet with a ceramic-sprayed coating having high thermal conductivity, which is formed on said insulation layer such that the ceramic sprayed coating contacts said insulation layer.

2. The thermoelectric module as set forth in claim 1, wherein said second resin material containing the ceramic powder is an epoxy resin containing an aluminum oxide powder.

3. The thermoelectric module as set forth in claim 1, wherein a content of the ceramic powder in said second resin material is within a range of 5 to 50 vol %.

4. The thermoelectric module as set forth in claim 1, wherein said metal sheet with the ceramic-sprayed coating is a copper foil with an aluminum-oxide sprayed coating.

5. The thermoelectric module as set forth in claim 1, wherein a thickness of the ceramic-sprayed coating is within a range of 10 to 100 $\mu$m.

6. The thermoelectric module as set forth in claim 1, comprising a conductive layer on said insulation layer of said second resin material containing the ceramic powder.

7. The thermoelectric module as set forth in claim 1, wherein said metal layer is made of at least one of nickel and tin.

8. A structure obtained by bonding the thermoelectric module as set forth in claim 1 to a stem having a base and pins passing through said base, wherein the thermoelectric module has a terminal portion through which electric power is supplied, and said terminal portion has a pair of through-holes for receiving said pins projecting on said base, so that said terminal portion is directly connected to said pins without using lead wires.

9. A method of manufacturing a thermoelectric module with improved heat-transfer efficiency, said method comprising the steps of:

preparing a thermoelectric chip with exposed surfaces of first-type and second-type thermoelectric elements on its top and bottom surfaces by arranging said thermoelectric elements in a matrix manner such that each of said first-type thermoelectric elements is disposed adjacent to said second-type thermoelectric element through a space, and filling said space with a first resin material having electrical insulation;

forming a metal layer formed on each of the exposed surfaces of said thermoelectric elements on the top and bottom surfaces of said thermoelectric chip;

forming first electrodes on the top surface of said thermoelectric chip according to a first circuit pattern such that each of the first electrodes electrically connects between adjacent thermoelectric elements; and forming second electrodes on the bottom surface of said thermoelectric chip according to a second circuit pattern different from the first circuit pattern such that each of the second electrodes electrically connects between adjacent thermoelectric elements; and bonding an electrical insulation sheet of a second resin material containing a ceramic powder with high thermal conductivity to at least one of the top surface with the first electrodes and the bottom surface with the second electrodes of said thermoelectric chip.

10. A method of manufacturing a thermoelectric module with improved heat-transfer efficiency, said method comprising the steps of:

preparing a thermoelectric chip with exposed surfaces of first-type and second-type thermoelectric elements on its top and bottom surfaces by arranging said thermoelectric elements in a matrix manner such that each of said first-type thermoelectric elements is disposed adjacent to said second-type thermoelectric element through a space, and filling said space with a first resin material having electrical insulation;

forming a metal layer formed on each of the exposed surfaces of said thermoelectric elements on the top and bottom surfaces of said thermoelectric chip;

forming first electrodes on the top surface of said thermoelectric chip according to a first circuit pattern such that each of the first electrodes electrically connects between adjacent thermoelectric elements; and forming second electrodes on the bottom surface of said thermoelectric chip according to a second circuit pattern different from the first circuit pattern such that each of the second electrodes electrically connects between adjacent thermoelectric elements;

placing an electrical-insulation adhesive sheet of a third resin material on at least one of the top surface with the first electrodes and the bottom surface with the second electrodes of said thermoelectric chip;

placing a metal sheet with a ceramic-sprayed coating having high thermal conductivity on said adhesive sheet such that the ceramic-sprayed coating contacts said adhesive sheet; and bonding said metal sheet to said thermoelectric chip by said adhesive sheet.

* * * * *